(12) United States Patent
Lin

(10) Patent No.: US 12,546,346 B2
(45) Date of Patent: Feb. 10, 2026

(54) PUSH-PULL ROTATING MECHANISM AND LATCH DEVICE HAVING THE SAME

(71) Applicant: Fulian Precision Electronics (Tianjin) Co., LTD., Tianjin (CN)

(72) Inventor: Jia-Feng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 463 days.

(21) Appl. No.: 18/349,169

(22) Filed: Jul. 9, 2023

(65) Prior Publication Data

US 2024/0295257 A1    Sep. 5, 2024

(30) Foreign Application Priority Data

Mar. 1, 2023 (CN) .......................... 202310195394.X

(51) Int. Cl.
*F16B 2/18*    (2006.01)
*H05K 5/02*    (2006.01)

(52) U.S. Cl.
CPC ........... *F16B 2/185* (2013.01); *H05K 5/0221* (2013.01); *H05K 5/023* (2013.01); *Y10T 403/591* (2015.01)

(58) Field of Classification Search
CPC .. F16B 2/18; F16B 2/185; F16B 5/008; F16B 5/0084; H05K 5/0221; H05K 5/023; H05K 7/1401; H05K 7/1402; H05K 7/1409; H05K 7/1487; H05K 7/1488; H05K 7/1489; Y10T 403/59; Y10T 403/591; Y10T 403/595
See application file for complete search history.

(56) References Cited

U.S. PATENT DOCUMENTS

| | | | | |
|---|---|---|---|---|
| 7,292,456 B2 * | 11/2007 | Leung | ................. | H05K 7/1409 361/801 |
| 7,301,778 B1 * | 11/2007 | Fang | .................... | H05K 7/1409 361/801 |
| 8,077,473 B1 * | 12/2011 | Lewis | ................. | H05K 7/1409 361/759 |
| 8,096,627 B2 * | 1/2012 | Lin | ....................... | E05B 65/006 312/325 |
| 8,593,827 B1 * | 11/2013 | Lewis | ................. | H05K 7/1411 361/801 |
| 9,107,321 B2 * | 8/2015 | Yin | ....................... | H05K 7/1489 |
| 9,930,804 B2 * | 3/2018 | Lu | ......................... | H05K 7/1489 |
| 10,368,460 B1 * | 7/2019 | Yang | .................... | H05K 7/1411 |
| 10,667,424 B2 * | 5/2020 | Lin | ....................... | H05K 7/1411 |

(Continued)

*Primary Examiner* — Amber R Anderson
*Assistant Examiner* — Kevin J Baynes
(74) *Attorney, Agent, or Firm* — ScienBiziP, P.C.

(57) ABSTRACT

A push-pull rotating mechanism includes a first fixing member, a pulling member, a rotating member, a connecting member, and a steering member. The first fixing member includes a first side plate and a second side plate connected to the first side plate; the pulling member is movably disposed on the first side plate, the pulling member defines a first slideway, the rotating member is rotatably disposed on the second side plate, and the rotating member protrudes to form a first pin. The connecting member includes a first end, a second end, and a connecting portion connected between the first end and the second end, the first end corresponding to the first slideway is provided with a second pin, the second pin is movably inserted into the first slideway, the connecting portion is rotatably disposed on the first side plate, and the second end protrudes to form a third pin.

19 Claims, 9 Drawing Sheets

(56) References Cited

U.S. PATENT DOCUMENTS

| | | | | |
|---|---|---|---|---|
| 10,759,039 B2* | 9/2020 | Wu | .................. | H05K 5/023 |
| 11,147,183 B2* | 10/2021 | Tsorng | ................ | H05K 7/1417 |
| 11,317,529 B2* | 4/2022 | Chang | .................... | G06F 1/187 |
| 11,523,532 B2* | 12/2022 | Liu | .................... | H05K 7/1488 |
| 11,706,889 B1* | 7/2023 | Zhong | ............... | H05K 7/20172 |
| | | | | 361/695 |
| 11,765,850 B2* | 9/2023 | Tan | .................... | H05K 7/1489 |
| | | | | 29/760 |
| 11,991,852 B2* | 5/2024 | Shih | .................... | H05K 7/1487 |
| 12,163,545 B2* | 12/2024 | Iwama | .................... | H02G 1/04 |
| 2021/0274667 A1* | 9/2021 | Lin | .................... | H05K 7/1401 |
| 2023/0122860 A1* | 4/2023 | Escamilla | ........... | H05K 7/1489 |
| | | | | 361/679.58 |

* cited by examiner

PUSH-PULL ROTATING MECHANISM AND LATCH DEVICE HAVING THE SAME

FIELD

The subject matter herein generally relates to a push-pull rotating mechanism and a latch device having the rotating mechanism.

BACKGROUND

A housing of a server is movably mounted in a server cabinet, and a latch mechanism is disposed between the housing and the server cabinet. The latch mechanism mainly includes a handle and a latch hook connected to the handle. The handle, which rotates by a user, can drive the latch hook to rotate, so that the latch hook can engage the housing with or disengage the housing from the server cabinet.

However, the handle is designed to be long for effort-saving purpose, which results in a larger space occupied by the rotating handle and is not conducive to actual operation.

BRIEF DESCRIPTION OF THE DRAWINGS

Implementations of the present technology will now be described, by way of example only, with reference to the attached FIGS., wherein.

DETAILED DESCRIPTION

Figure 1:
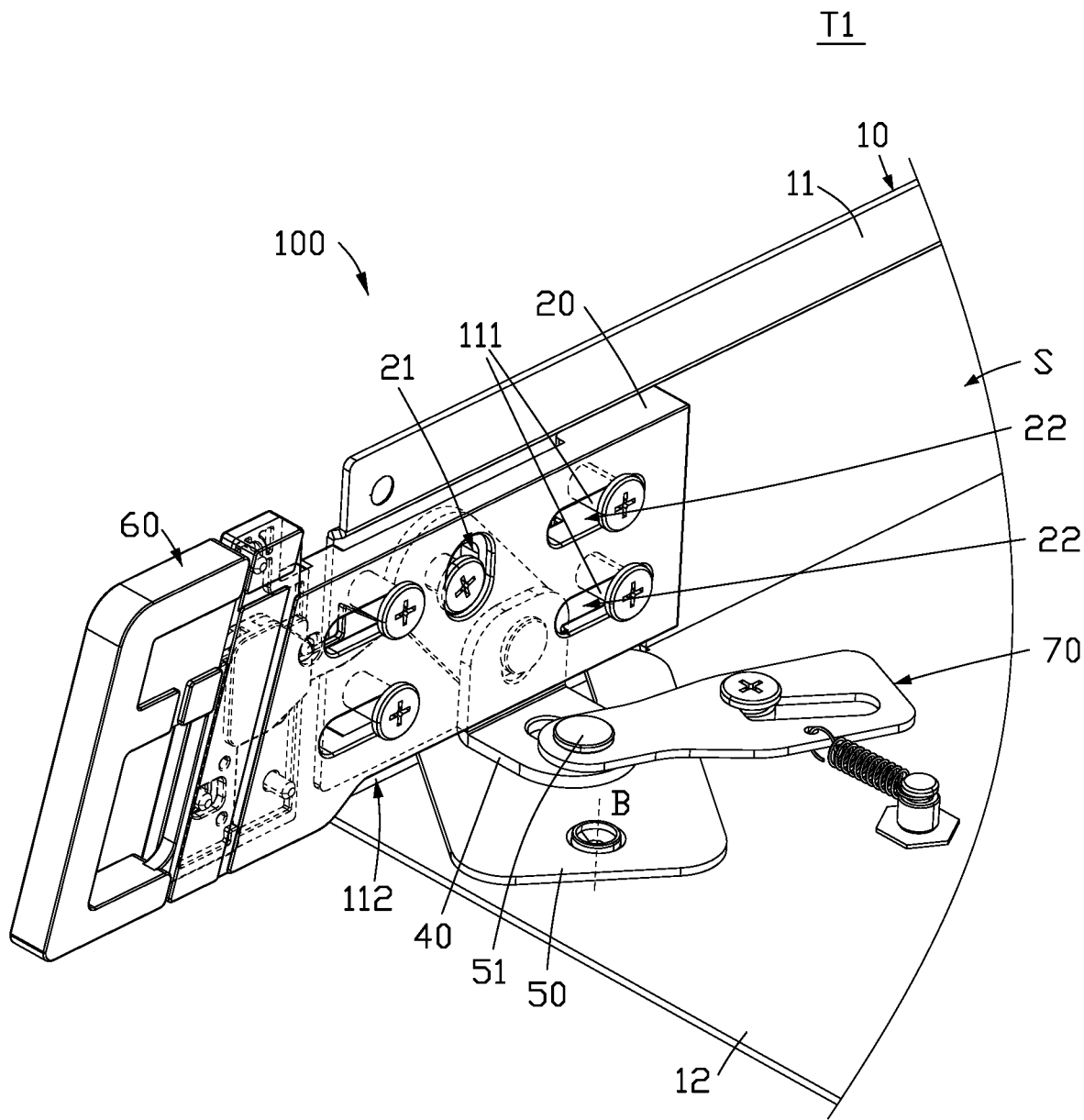
FIG. 1 is a diagrammatic view of a push-pull rotating mechanism according to an embodiment of the present disclosure, wherein the push-pull rotating mechanism in a first state.

It will be appreciated that for simplicity and clarity of illustration, where appropriate, reference numerals have been repeated among the different FIGS. to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 2:
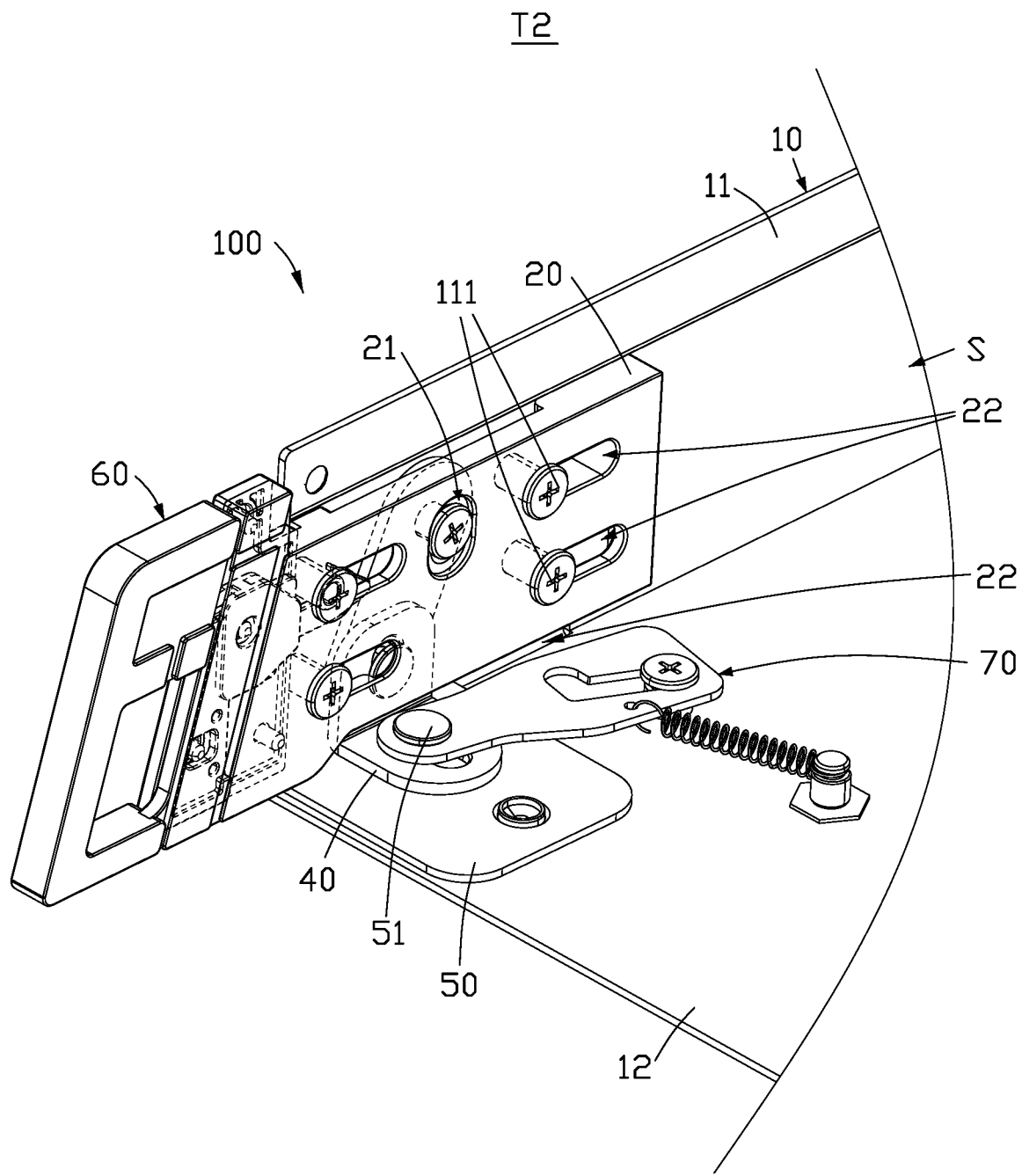
FIG. 2 is similar to FIG. 1, but showing the push-pull rotating mechanism in a second state.
Figure 9:
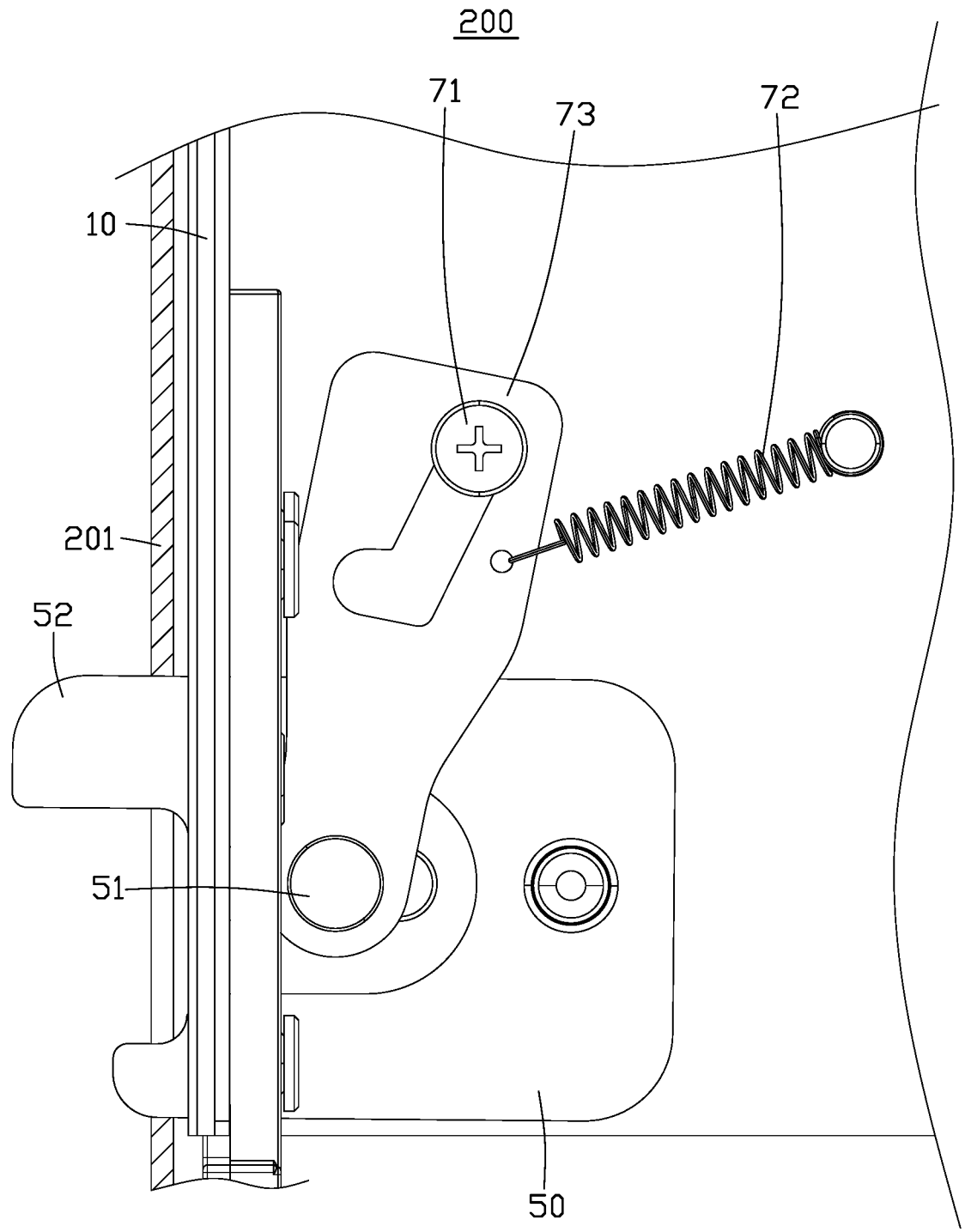
FIG. 9 is a top view of a latch device provided by an embodiment of the present disclosure.

Referring to FIGS. 1 and 2, an embodiment of the present disclosure provides a push-pull rotating mechanism 100. The push-pull rotating mechanism 100 may be applied in a server, and is used to engage the server with or disengage the server from a server cabinet (e.g., a second fixing member 201 as shown in FIG. 9). In other embodiments, the push-pull rotating mechanism 100 may be used in other electronic devices, such as desktop computers, transformers, etc.

The push-pull rotating mechanism 100 includes a first fixing member 10, a pulling member 20, a connecting member 30, a steering member 40, and a rotating member 50. The pulling member 20, the connecting member 30, the steering member 40, and the rotating member 50 are disposed on the first fixing member 10. The pulling member 20 is connected to the connecting member 30, and is used to drive the connecting member 30 to rotate. The connecting member 30 is connected to the steering member 40, and is used to drive the steering member 40 to move. The steering member 40 is connected to the rotating member 50, and is used to drive the rotating member 50 to rotate. During the rotation, the rotating member 50 can engage with or disengage from the second fixing member 201 (shown in FIG. 9).

The first fixing member 10 includes a first side plate 11 and a second side plate 12. The first side plate 11 is substantially vertically connected to the second side plate 12 to form an accommodating space S. The connecting member 30 and the steering member 40 are both accommodated in the accommodating space S. A portion of the pulling member 20 and a portion of the rotating member 50 can extend out of the accommodating space S.

The pulling member 20 is movably disposed on one side of the first side plate 11 toward the accommodating space S. The pulling member 20 defines a first slideway 21. The rotating member 50 is rotatably disposed on one side of the second side plate 12 toward the accommodating space S. The rotating member 50 protrudes outward to form a first pin 51.

The connecting member 30 is rotatably disposed on the side of the first side plate 11 toward the accommodating space S. The connecting member 30 includes a first end 31, a second end 32, and a connecting portion 33 connected between the first end 31 and the second end 32. The first end 31 corresponds to the first slideway 21 and is provided with a second pin 311, and the second pin 311 is movably inserted into the first slideway 21. The connecting portion 33 is rotatably connected to the first side plate 11 through a first rotating shaft A, and the second end 32 protrudes outward to form a third pin 321.

The steering member 40 is movably disposed between the connecting member 30 and the rotating member 50. The steering member 40 includes a first portion 41 and a second portion 42 connected to the first portion 41. The first portion 41 corresponds to the third pin 321 and is provided with a second slideway 411, and the third pin 321 is movably inserted into the second slideway 411. The second portion 42 corresponds to the first pin 51 and is provided with a third slideway 421, and the first pin 51 is movably inserted into the third slideway 421.

The first slideway 21 and the second pin 311 form a first guiding structure (not labeled). The second slideway 411 and the third pin 321 form a second guiding structure (not labeled). The third slideway 421 and the first pin 51 form a third guiding structure (not labeled). The working principle of the above three guiding structures are similar, which is achieved by moving a pin in a slideway. The difference is that a spatial position and extending direction of the respective slideway (e.g., the first slideway 21, the second slideway 411, or the third slideway 421) is different, or the spatial position and extending direction of the respective pin (e.g., the first pin 51, the second pin 311, or the third pin 321) is different. In other embodiments, the first slideway 21 is disposed on the first end 31, and the second pin 311 is disposed on the pulling member 20. The second slideway 411 is configured on the first end 31, and the third pin 321 is configured on the first portion 41. The third slideway 421 is located on the rotating member 50, and the first pin 51 is located on the second portion 42.

Referring to FIGS. 1 and 2, when in use, the pulling member 20 moves in one direction, the first slideway 21 guides the second pin 311 to move, causing the connecting member 30 to rotate. Meantime, the second slideway 411 guides the third pin 321 to move, causing the steering member 40 to move in the same direction with the pulling member 20. Meantime, the third slideway 421 guides the first pin 51 to move, causing the rotating member 50 to rotate until the rotating member 50 is engaged with or disengaged from the second fixing member 201.

The push-pull rotating mechanism 100 provided in this application achieves transmission between the pulling member 20 and the connecting member 30 through the first guiding structure (the first slideway 21 and the second pin 311). The push-pull rotating mechanism 100 also achieves transmission between the connecting member 30 and the steering member 40 through the second guiding structure (the second slideway 411 and the third pin 321). The push-pull rotating mechanism 100 also achieves transmission between the steering member 40 and the rotating member 50 through the third guiding structure (the third slideway 421 and the first pin 51). Thus, the push-pull rotating mechanism 100 can achieve flexible transmission, which can reduce the total number of components of the push-pull rotating mechanism 100 and can reduce the space occupied by the operation of the push-pull rotating mechanism 100.

Referring to FIGS. 1 and 2, in this embodiment, the first side plate 11 protrudes toward the pulling member 20 to form a plurality of limiting posts 111. The pulling member 20 defines a plurality of limiting groove 22 corresponding to each of the limiting posts 111. The limiting groove 22 has an extending direction (not shown). Each of the limiting posts 111 can be movably accommodated in the limiting groove 22 along the extending direction of the limiting groove 22. The extending direction of the limiting groove 22 is different from an extending direction (not shown) of the first slideway 21, so that a linear movement of the pulling member 20 can drive the connecting member 30 to rotate.

Figure 4:
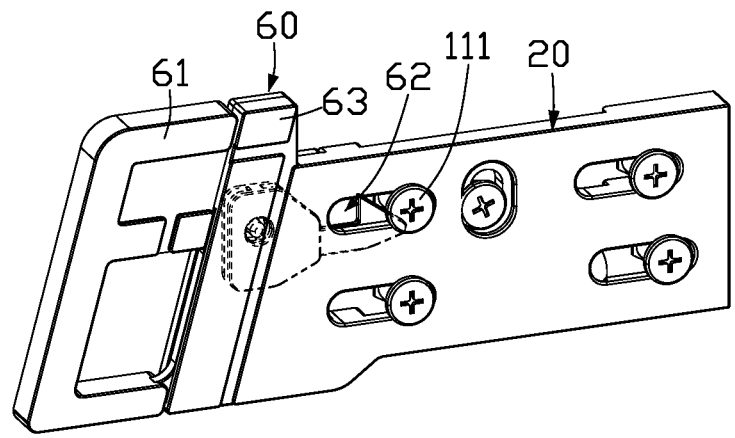
FIG. 4 is a diagrammatic view showing the pulling handle and a pulling member of the push-pull rotating mechanism of FIG. 1 assembled together.
Figure 5:
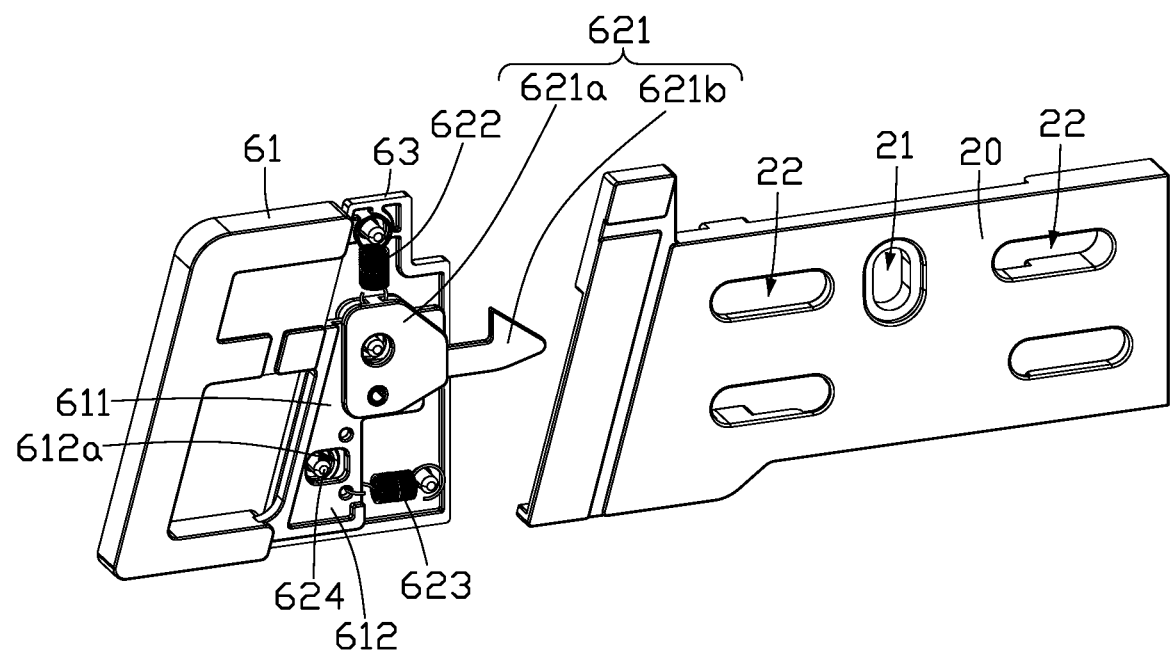
FIG. 5 is a diagrammatic view of the disassembly of the pull-out handle and the pull-out part of the push-pull rotating mechanism of FIG. 1.

Referring to FIGS. 4 and 5, in this embodiment, the push-pull rotating mechanism 100 further includes a pulling handle 60 connected to one end of the pulling member 20. The setting of the pulling handle 60 allows an operator to push and pull the pulling member 20, and can also have a function of locking the pulling member 20. The pulling handle 60 includes a handle portion 61, a hook assembly 62, and a housing 63 connecting the handle portion 61 and the hook assembly 62. The hook assembly 62 is detachably engaged with the limiting post 111. The handle portion 61 is connected to the hook assembly 62, and is used to drive the hook assembly 62 to engage with or disengage from the limiting post 111. One side of the housing 63 is also connected to the pulling member 20, so that the housing 63 can drive the pulling member 20 to move.

Referring to FIGS. 4 and 5, in this embodiment, the hook assembly 62 includes a movable hook 621, a first elastic member 622, a second elastic member 623, and a fixed post 624. The movable hook 621 includes a turning portion 621*a* and a hook portion 621*b* connected to the turning portion 621*a*. The turning portion 621*a* is rotatably connected to the housing 63, and the hook portion 621*b* is movably extend out of the housing 63, and the hook portion 621*b* can hook the limiting post 111. The handle portion 61 extends toward the housing 63 to form a pushing and turning portion 611 and a limiting portion 612 connected to the pushing and turning portion 611. The pushing and turning portion 611 is connected to one side of the turning portion 621*a*. One end of the first elastic member 622 is fixed in the housing 63, and another end of the first elastic member 622 is connected to another side of the turning portion 621*a*.

Each of the pushing and turning portion 611 and the first elastic member 622 applies a torque to the turning portion 621*a*. When the torque applied to the turning portion 621*a* by the pushing and turning portion 611 is greater than the torque applied by the first elastic member 622, the turning portion 621*a* is driven by the pushing and turning portion 611, while the first elastic member 622 is elastically deformed. When the torque applied to the turning portion 621*a* by the pushing and turning portion 611 is less than the torque applied by the first elastic member 622, the turning portion 621*a* is driven by the first elastic member 622, while the first elastic member 622 rebounds to return the turning portion 621*a* to its original position.

Referring to FIGS. 4 and 5, the limiting portion 612 defines a limiting hole 612*a*. An extending direction of the limiting hole 612*a* is substantially the same as an extending direction of the first slideway 21. One end of the fixed post 624 is fixedly disposed in the housing 63, and another end of the fixed post 624 is movably accommodated in the limiting hole 612*a*, so that the move range of the handle portion 61 is limited by the limiting hole 612*a* and the fixed post 624. Particularly, one end of the second elastic member 623 is fixed to the housing 63, and the other end of the second elastic member 623 is connected to the limiting portion 612. The second elastic member 623, when rebounds, can return the handle portion 61 to its initial position. In this embodiment, the first elastic member 622 and the second elastic member 623 are both springs.

Figure 6A:
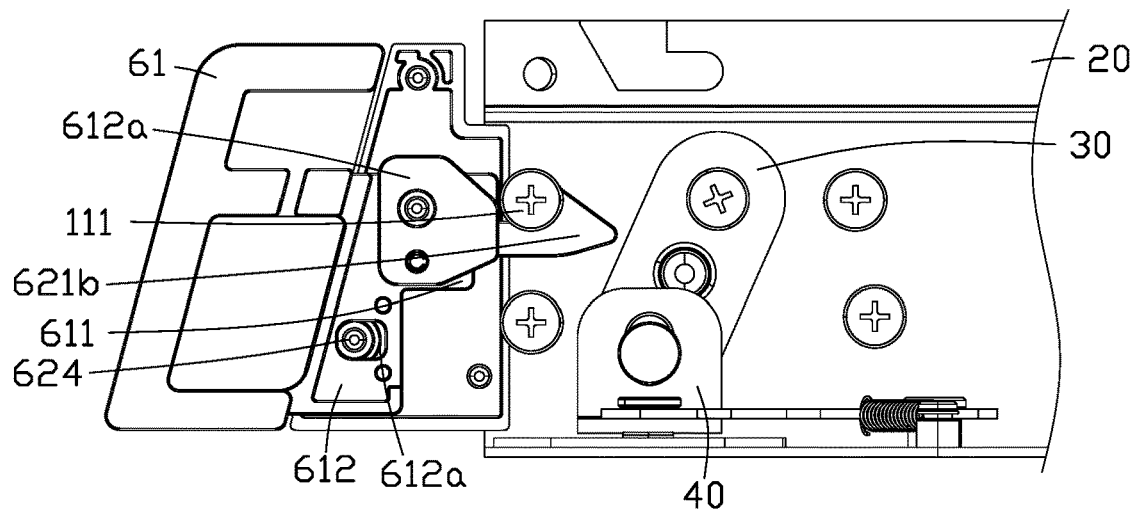
FIGS. 6A, 6B and 6C are diagrammatic views showing the pull-out handle moving relative to the pull-out part of FIG. 4.
Figure 6B:
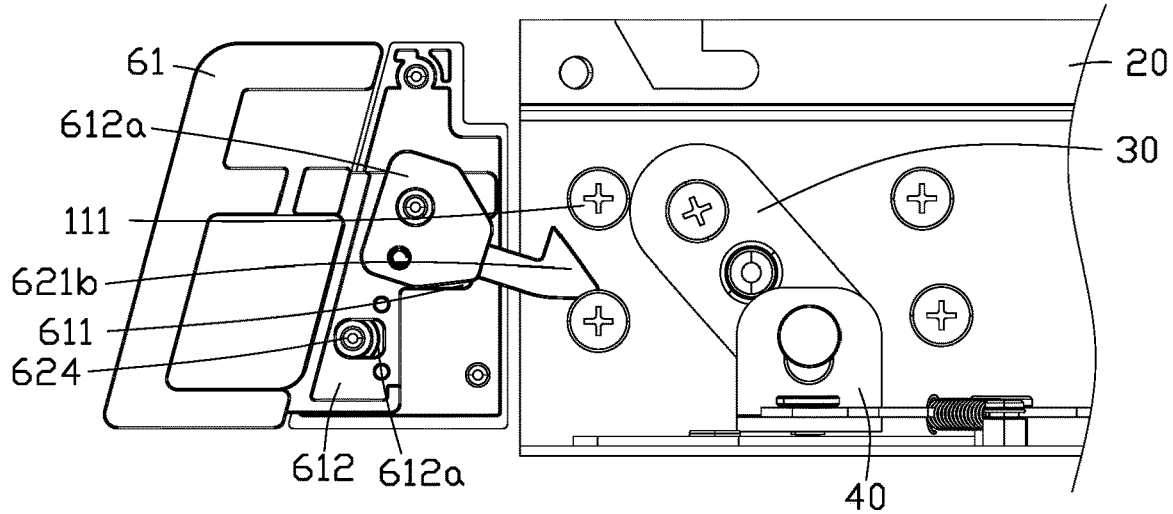

Referring to FIG. 6A, when the hook portion 621*b* of the pulling handle 60 is engaged with the limiting post 111, the operator can pull out the pulling handle 60 successively by the following three steps:

First, referring to FIG. 6B, the operator pulls out the handle portion 61, so that the pushing and turning portion 611 drives the turning portion 621*a* to rotate, while the handle portion 61 is pulled out relative to the housing 63.

Figure 6C:
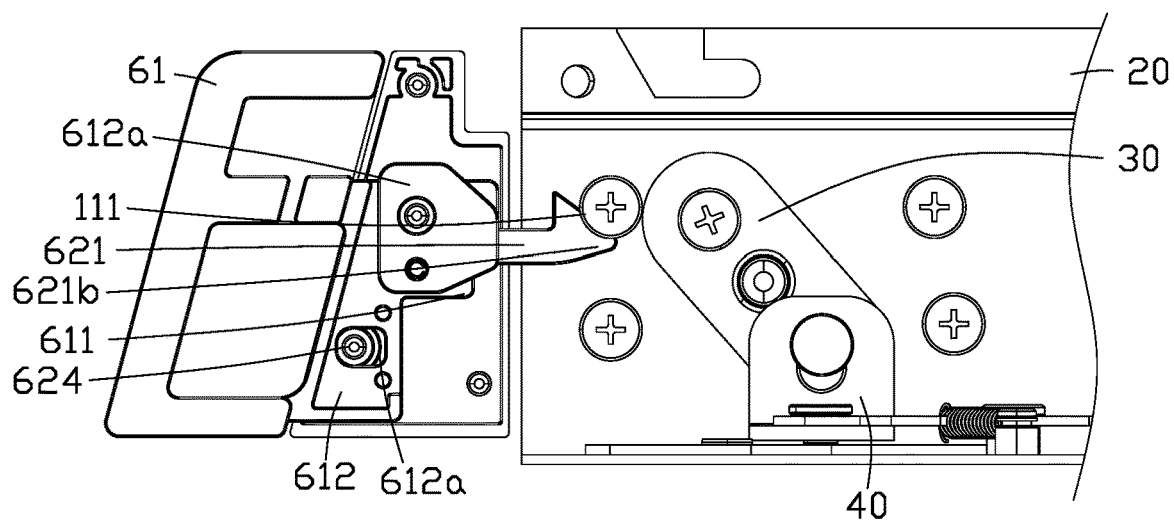

Second, referring to FIG. 6C, the fixed post 624 abuts against one end wall of the limiting hole 612*a*. The fixed post 624 limits the limiting portion 612 from continuing moving relative to the housing 63. The handle portion 61 cannot continue being pulled out relative to the housing 63, that is, the pushing and turning portion 611 cannot continue driving the turning portion 621*a* to rotating. At this time, the hook portion 621*b* is disengaged from the limiting post 111.

Third, referring to FIG. 6C, the operator continues to pull out the handle portion 61. The limiting portion 612 pulls the housing 63 so that the handle portion 61 and the housing 63 continue being pulled out. The housing 63 connected to the pulling member 20 continues being pulled out. The pulled out pulling member 20 can drive the connecting member 30, the steering member 40, and the rotating member 50 to operate until the rotating member 50 rotates to a predetermined position. At this time, the operator can stop pulling out the handle portion 61.

Referring to FIG. 6C, when the movable hook 621 of the pulling handle 60 is disengaged with the limiting post 111, the operator can push the pulling handle 60 by the following two steps:

First, referring to FIG. 6C, pushing in the handle portion 61 so that an inclined surface of the hook portion 621*b* hits the limiting post 111. The hook portion 621*b* can rotate until the hook portion 621*b* hooks the limiting post 111 again.

Second, refer to FIG. 6A, continue to push in the handle portion 61. The fixed post 624 abuts against the other end wall of the limiting hole 612*a*, causing the housing 63 to push the pulling member 20 inward. The pulling member 20 drives the connecting member 30, the steering member 40, and the rotating member 50 to operate until the rotating member 50 rotates to a predetermined position. The operator can stop pushing in the handle portion 61.

Figure 3:
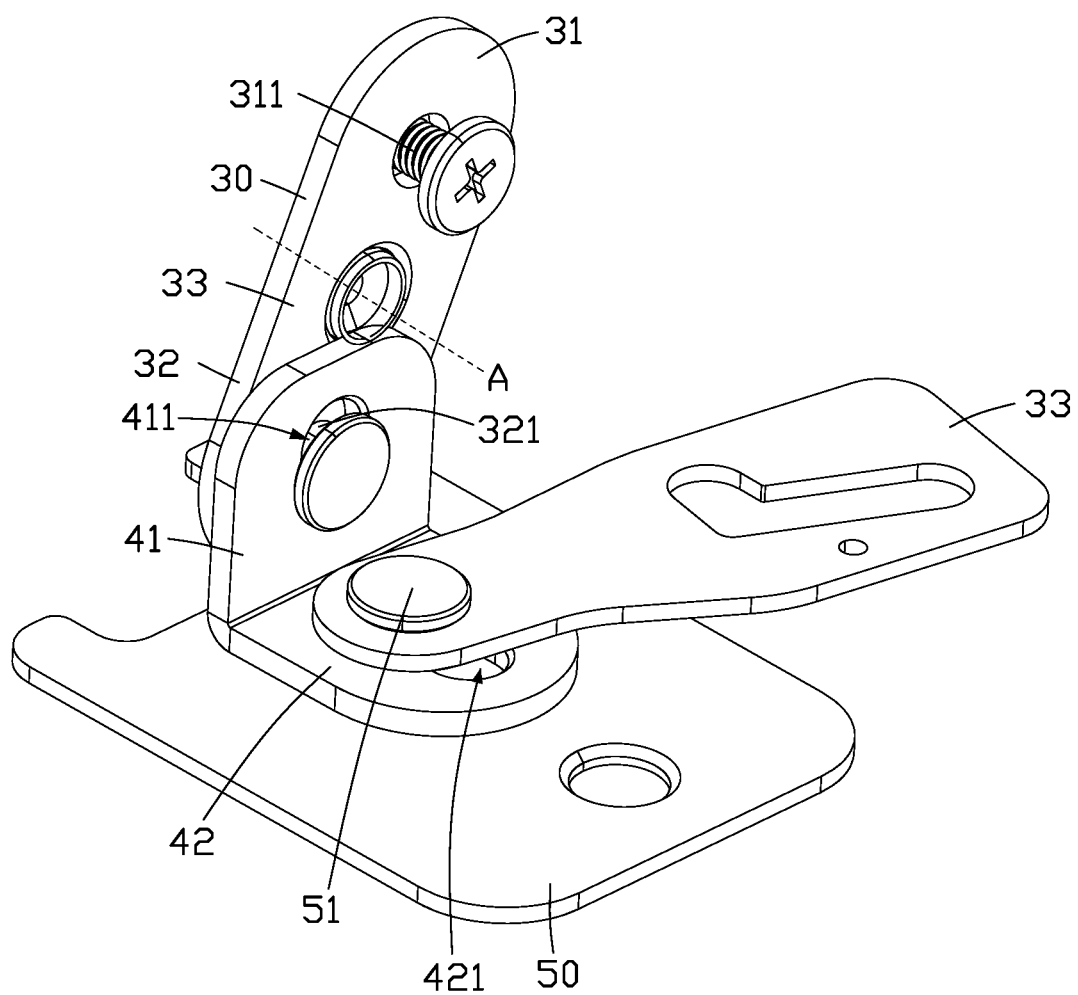
FIG. 3 is a diagrammatic view of the push-pull rotating mechanism of FIG. 1, after a first fixing part and a pull-out handle are removed.

Referring to FIGS. 1, 2, and 3, in this embodiment, the push-pull rotating mechanism 100 further includes a locking member 70 disposed on the second side plate 12. The locking member 70 includes a limiting post 71, a third elastic member 72, and a clamping plate 73. One end of each of the limiting post 71 and the third elastic member 72 is fixed to the second side plate 12. One end of the clamping plate 73 is sleeved on the end of the first pin 51. The other end of the clamping plate 73 penetrates to provide a first limiting slot 731 and a second limiting slot 732 communicating with the first limiting slot 731. The extending directions of the first limiting slot 731 and the second limiting slot 732 are different. The other end of the third elastic member 72 is connected to the clamping plate 73. The other end of the limiting post 71 is movably disposed in the first limiting slot 731 or the second limiting slot 732. Since the extending directions of the first limiting slot 731 and the second limiting slot 732 are different, when the limiting post 71 slides from the first limiting slot 731 into the second limiting slot 732, it is limited by the second limiting slot 732, thereby preventing the rotating member 50 from further rotating clockwise.

The third elastic member 72 is used to provide a restoring force to pull the limiting post 71 to slide from the second limiting slot 732 to the first limiting slot 731.

Referring to FIGS. 1, 2, and 3, in this embodiment, the rotating member 50 is rotatably disposed on the second side plate 12 around a second rotating shaft B. The second rotating shaft B is offset from the center axis (not shown) of the first pin 51, thereby ensuring that the first pin 51 can apply a rotational torque to the rotating member 50, causing the rotating member 50 to rotate around the second rotating shaft B.

Referring to FIGS. 1, 2, and 3, in this embodiment, the first side plate 11 and the second side plate 12 form a first angle (not shown). The steering member 40 includes a first portion 41 connected to the connecting member 30 and a second portion 42 connected to the rotating member 50. The first portion 41 and the second portion 42 form a second angle, and the first angle is the same as the second angle. This helps to reduce the internal stress received by the connecting member 30 and the steering member 40 during movement. Particularly, the first angle and the second angle are both 90 degrees.

Referring to FIGS. 1, 2, and 3, in this embodiment, a first slot 112 is provided at the connection between the first side plate 11 and the second side plate 12. The rotating member 50 further includes a clamping portion 52, and the clamping portion 52 can rotate into and through the first slot 112. When the rotating member 50 rotates, the clamping portion 52 can rotate into and through the first slot 112 to extend out of the accommodating space S. Alternatively, the clamping portion 52 can rotate out of and again pass through the first slot 112 to be re-accommodated in the accommodating space S.

Referring to FIGS. 1, 2, 7, and 8, in this embodiment, when the push-pull rotating mechanism 100 is in specific operation, it can be roughly divided into two states: a first state T1 and a second state T2.

Figure 7:
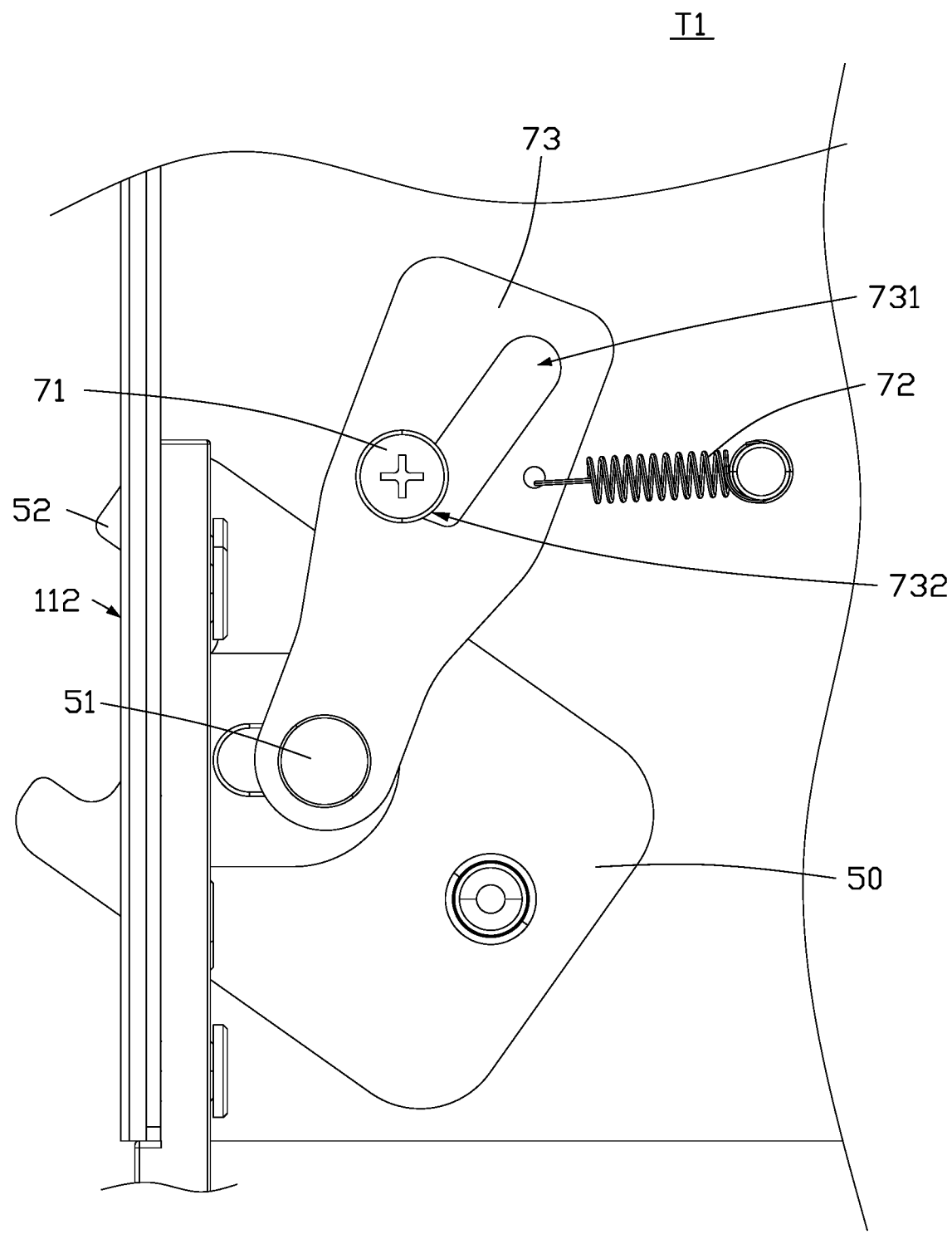
FIG. 7 is a top view of the push-pull rotating mechanism of FIG. 1.

Referring to FIGS. 1 and 7, the first state T1 includes: the movable hook 621 of the pulling handle 60 is disengaged from the limiting post 111; the clamping portion 52 does not pass through the first slot 112; and the first limiting post 53 is movably accommodated in the second limiting slot 512.

Figure 8:
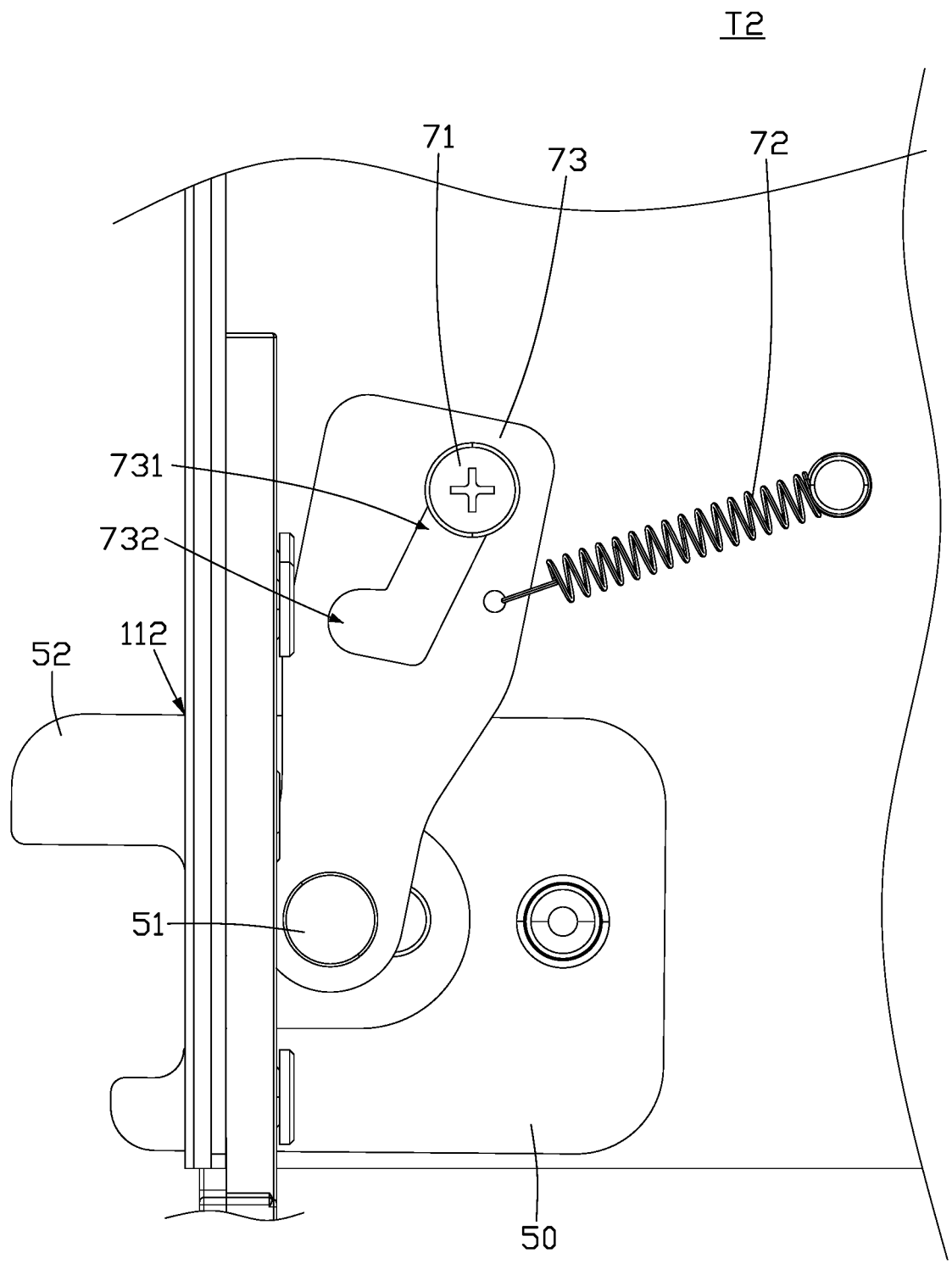
FIG. 8 is a top view of the push-pull rotating mechanism of FIG. 2.

Referring to FIGS. 2 and 8, the second state T2 includes: the movable hook 621 of the pulling handle 60 hooks the limiting post 111; part of the clamping portion 52 protrudes out of the first slot 112; and the first limiting post 53 is accommodated in the first limiting slot 511.

Referring to FIGS. 2, 8, and 9, an embodiment of the present disclosure also provides a latch device 200. The latch device 200 includes a second fixing member 201 and the push-pull rotating mechanism 100. The second fixing member 201 penetrates to provide a second slot 202 corresponding to the first slot 112. The clamping portion 52 can pass through the first slot 112 and extend into the second slot 202 to engage the first fixing member 10 with the second fixing member 201. When in use, referring to FIGS. 7 and 8, the push-pull rotating mechanism 100 in the first state T1; then, the push-pull rotating mechanism 100 in the first state T1 is placed corresponding to the second fixing member 201, so that the first slot 112 corresponds to the second slot 202; finally, the push-pull rotating mechanism 100 is switched from the first state T1 to the second state T2, so that the clamping portion 52 passes through the first slot 112 and extends into the second slot 202 to engage the push-pull rotating mechanism 100 with the second fixing member 201.

The embodiments shown and described above are only examples. Many details are often found in the art such as the other features of the latch device 200. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A push-pull rotating mechanism comprising:
    a first fixing member;
    a pulling member;
    a rotating member;
    a connecting member; and
    a steering member,
    wherein the first fixing member comprises a first side plate and a second side plate connected to the first side plate, the pulling member is movably disposed on one side of the first side plate toward the second side plate, the pulling member defines a first slideway, the rotating member is rotatably disposed on one side of the second side plate toward the first side plate, and the rotating member protrudes outward to form a first pin, the connecting member comprises a first end, a second end, and a connecting portion connected between the first end and the second end, the first end corresponding to the first slideway is provided with a second pin, the second pin is movably inserted into the first slideway, the connecting portion is rotatably disposed on the first side plate, and the second end protrudes outward to form a third pin, and the steering member comprises a first portion and a second portion connected to the first portion, the first portion corresponding to the third pin defines a second slideway, the third pin is movably inserted into the second slideway, the second portion corresponding to the first pin defines a third slideway, and the first pin is movably inserted into the third slideway.

2. The push-pull rotating mechanism of claim 1, wherein the first side plate protrudes toward the pulling member to form a limiting post, the pulling member defines a limiting groove corresponding to the limiting post, the limiting post is movably inserted into the limiting groove, an extending direction of the limiting groove is different from an extending direction of the first slideway.

3. The push-pull rotating mechanism of claim 2, further comprising:
a pulling handle, wherein the pulling handle comprises a handle portion and a hook assembly, the hook assembly is connected between the handle portion and the pulling member, and the hook assembly comprise a movable hook configured to be engaged with the limiting post.

4. The push-pull rotating mechanism of claim 3, wherein the pulling handle further comprises a housing connecting the handle portion and the hook assembly, the movable hook comprises a turning portion and a hook portion connected to the turning portion, the turning portion is rotatably disposed in the housing, the hook portion movably extends out of the housing, the hook portion is configured to be engaged with the limiting post, the handle portion extends toward the housing to form a pushing and turning portion and a limiting portion connected to the pushing and turning portion, the pushing and turning portion is connected to one side of the turning portion, and the limiting portion defines a limiting hole penetrating therethrough, and the hook assembly further comprises a fixed post, one end of the fixed post is disposed in the housing, another end of the fixed post is movably inserted into the limiting hole.

5. The push-pull rotating mechanism of claim 4, wherein the hook assembly further comprises a first elastic member and a second elastic member, one end of the first elastic member and one end of the second elastic member are fixedly disposed in the housing, another end of the first elastic member is connected to the turning portion, and another end of the second elastic member is connected to the limiting portion.

6. The push-pull rotating mechanism of claim 1, further comprising:
a locking member disposed on the second side plate, the locking member comprising a limiting post, a third elastic member, and a clamping plate, one end of the limiting post and one end of the third elastic member are fixed to the second side plate, one end of the clamping plate is sleeved on the first pin, the clamping plate defines a first limiting slot and a second limiting slot communicating with the first limiting slot, an extending direction of the first limiting slot is different from an extending direction of the second limiting slot; and another end of the third elastic member is connected to the clamping plate, and another end of the limiting post is movably disposed in the first limiting slot or the second limiting slot.

7. The push-pull rotating mechanism of claim 1, wherein the rotating member is configured to rotate around a rotating shaft, and a central axis of the rotating shaft is misaligned with a central axis of the first pin.

8. The push-pull rotating mechanism of claim 1, wherein the first side plate and the second side plate form a first angle, the first portion and the second portion forming a second angle, and the first angle is equal to the second angle.

9. The push-pull rotating mechanism of claim 8, wherein the first angle and the second angle are equal to 90 degrees.

10. The push-pull rotating mechanism of claim 1, wherein the first fixing member defines a first slot, the first slot is located between the first side plate and the second side plate, the rotating member further comprises a clamping portion, and the clamping portion is configured to extend through the first slot.

11. A latch device comprising:
a push-pull rotating mechanism comprising:
a first fixing member;
a pulling member;
a rotating member;
a connecting member; and
a steering member; and
a second fixing member,
wherein the first fixing member comprises a first side plate and a second side plate connected to the first side plate, the pulling member is movably disposed on one side of the first side plate toward the second side plate, the pulling member defines a first slideway, the rotating member is rotatably disposed on one side of the second side plate toward the first side plate, and the rotating member protrudes outward to form a first pin, the connecting member comprises a first end, a second end, and a connecting portion connected between the first end and the second end, the first end corresponding to the first slideway is provided with a second pin, the second pin is movably inserted into the first slideway, the connecting portion is rotatably disposed on the first side plate, and the second end protrudes outward to form a third pin, the steering member comprises a first portion and a second portion connected to the first portion, the first portion corresponding to the third pin defines a second slideway, the third pin is movably inserted into the second slideway, the second portion corresponding to the first pin defines a third slideway, and the first pin is movably inserted into the third slideway, and the first fixing member defines a first slot, the rotating member further comprises a clamping portion, the second fixing member defines a second slot corresponding to the first slot, the clamping portion is used to extend through the first slot and extend into the second slot.

12. The latch device of claim 11, wherein the first side plate protrudes toward the pulling member to form a limiting post, the pulling member defines a limiting groove corresponding to the limiting post, the limiting post is movably inserted into the limiting groove, an extending direction of the limiting groove is different from an extending direction of the first slideway.

13. The latch device of claim 12, the push-pull rotating mechanism further comprising:
a pulling handle, wherein the pulling handle comprises a handle portion and a hook assembly, the hook assembly is connected between the handle portion and the pulling member, and the hook assembly comprise a movable hook configured to be engaged with the limiting post.

14. The latch device of claim 13, wherein the pulling handle further comprises a housing connecting the handle portion and the hook assembly, the movable hook comprises a turning portion and a hook portion connected to the turning portion, the turning portion is rotatably disposed in the housing, the hook portion movably extends out of the housing, the hook portion is configured to be engaged with the limiting post, the handle portion extends toward the housing to form a pushing and turning portion and a limiting portion connected to the pushing and turning portion, the pushing and turning portion is connected to one side of the turning portion, and the limiting portion defines a limiting hole penetrating therethrough, and
the hook assembly further comprises a fixed post, one end of the fixed post is disposed in the housing, another end of the fixed post is movably inserted into the limiting hole.

15. The latch device of claim 14, wherein the hook assembly further comprises a first elastic member and a second elastic member, one end of the first elastic member and one end of the second elastic member are fixedly disposed in the housing, another end of the first elastic member is connected to the turning portion, and another end of the second elastic member is connected to the limiting portion.

16. The latch device of claim 11, the push-pull rotating mechanism further comprising:
a locking member disposed on the second side plate, the locking member comprising a limiting post, a third elastic member, and a clamping plate, one end of the limiting post and one end of the third elastic member are fixed to the second side plate, one end of the clamping plate is sleeved on the first pin, the clamping plate defines a first limiting slot and a second limiting slot communicating with the first limiting slot, an extending direction of the first limiting slot is different from an extending direction of the second limiting slot; and
another end of the third elastic member is connected to the clamping plate, and another end of the limiting post is movably disposed in the first limiting slot or the second limiting slot.

17. The latch device of claim 11, wherein the rotating member is configured to rotate around a rotating shaft, and a central axis of the rotating shaft is misaligned with a central axis of the first pin.

18. The latch device of claim 11, wherein the first side plate and the second side plate form a first angle, the first portion and the second portion forming a second angle, and the first angle is equal to the second angle.

19. The latch device of claim 18, wherein the first angle and the second angle are equal to 90 degrees.

* * * * *